(12) United States Patent
Huang et al.

(10) Patent No.: US 10,803,776 B2
(45) Date of Patent: Oct. 13, 2020

(54) FLEXIBLE DISPLAY PANEL, DISPLAY DEVICE, AND METHOD FOR MANUFACTURING FLEXIBLE DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventors: Weiyun Huang, Beijing (CN); Tingliang Liu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/339,205

(22) PCT Filed: Sep. 21, 2017

(86) PCT No.: PCT/CN2017/102744
§ 371 (c)(1),
(2) Date: Apr. 3, 2019

(87) PCT Pub. No.: WO2018/176760
PCT Pub. Date: Oct. 4, 2018

(65) Prior Publication Data
US 2019/0287433 A1    Sep. 19, 2019

(30) Foreign Application Priority Data

Mar. 30, 2017   (CN) .......................... 2017 1 0202454

(51) Int. Cl.
*G09F 9/30* (2006.01)
*H01L 27/32* (2006.01)
(Continued)

(52) U.S. Cl.
CPC .......... *G09F 9/301* (2013.01); *H01L 27/1244* (2013.01); *H01L 27/1248* (2013.01);
(Continued)

(58) Field of Classification Search
CPC ............ H01L 27/3297; H01L 27/3258; H01L 27/3276; H01L 51/0097; H01L 51/0096
See application file for complete search history.

(56) References Cited

U.S. PATENT DOCUMENTS 6,664,730 B2    12/2003   Weaver
9,490,215 B2    11/2016   Yang
(Continued)

FOREIGN PATENT DOCUMENTS

CN    104950535        9/2015
CN    104950553 A  *  9/2015  ........... G02F 1/1368
(Continued)

OTHER PUBLICATIONS

International Search Report and Written Opinion dated Jan. 5, 2018 for PCT Patent Application PCT/CN2017/102744.
(Continued)

*Primary Examiner* — Mariceli Santiago
(74) *Attorney, Agent, or Firm* — Thomas | Horstemeyer LLP

(57) ABSTRACT

The present disclosure relates to a flexible display panel, a display device, and a manufacturing method of the flexible display panel. The flexible display panel includes: a flexible base substrate, a conducting layer arranged in a display region of the flexible base substrate, a plurality of wires arranged in an edge bendable region of the flexible base substrate, and an inorganic insulating layer arranged between the conducting layer and the plurality of wires and the flexible base substrate. Furthermore, the flexible display panel also includes: a first organic insulating layer at least
(Continued)

arranged between the plurality of wires in the edge bendable region of the flexible base substrate and the inorganic insulating layer. A material of the first organic insulating layer is a cured photoresist.

5 Claims, 8 Drawing Sheets

(51) Int. Cl.
    *H01L 51/00*     (2006.01)
    *H01L 27/12*     (2006.01)

(52) U.S. Cl.
    CPC ...... *H01L 27/1259* (2013.01); *H01L 27/3258* (2013.01); *H01L 27/3276* (2013.01); *H01L 51/0097* (2013.01)

(56) References Cited

U.S. PATENT DOCUMENTS

| | | |
|---|---|---|
| 9,698,162 B2 | 7/2017 | Jeong |
| 2003/0006697 A1 | 1/2003 | Weaver |
| 2016/0218305 A1 | 7/2016 | Kim et al. |
| 2016/0291438 A1 | 10/2016 | Lo et al. |
| 2017/0062532 A1 | 3/2017 | Jeong |
| 2017/0262109 A1* | 9/2017 | Choi ................. G06F 3/0412 |
| 2017/0288005 A1* | 10/2017 | Kawata ............. H01L 27/1248 |
| 2017/0309651 A1* | 10/2017 | Kim ................. H01L 27/1225 |
| 2017/0317299 A1* | 11/2017 | Choi ................. H01L 27/3262 |
| 2018/0047920 A1* | 2/2018 | Jang ................. B32B 5/145 |
| 2018/0083211 A1* | 3/2018 | Lee ................. H01L 27/3258 |
| 2018/0366586 A1* | 12/2018 | Son ................. H01L 51/0097 |

FOREIGN PATENT DOCUMENTS

| | | |
|---|---|---|
| CN | 105826350 | 8/2016 |
| CN | 105892192 | 8/2016 |
| CN | 106252380 | 12/2016 |
| CN | 106486491 | 3/2017 |
| CN | 106972030 | 7/2017 |
| EP | 3051333 | 8/2016 |

OTHER PUBLICATIONS

Office Action dated Dec. 5, 2018 for Chinese Patent Application 201710202454.0.

* cited by examiner

FLEXIBLE DISPLAY PANEL, DISPLAY DEVICE, AND METHOD FOR MANUFACTURING FLEXIBLE DISPLAY PANEL

CROSS REFERENCE TO RELATED APPLICATIONS

The present application is a § 371 national phase application of PCT/CN2017/102744, filed Sep. 21, 2017, which claims the benefit of and priority to Chinese Patent Application No. 201710202454.0, filed on Mar. 30, 2017, the entire contents of which are incorporated herein by reference.

FIELD OF THE INVENTION

The present disclosure generally relates to the field of display technologies, and more particularly, to a flexible display panel, a display device, and a manufacturing method of the flexible display panel.

BACKGROUND

Currently, the display market is booming, and more new display products will emerge in large numbers in the future with consumers' increasing demands for various display products such as laptops, smartphones, TV sets, tablet computers, smart watches and fitness wristbands, etc.

Full-screen bezel-free display products may provide users with a better viewing experience and will inevitably flourish new consumer markets. Pad Bendable is a core technology of the full-screen bezel-free display products.

BRIEF SUMMARY OF INVENTION

Embodiments of the present disclosure provide a flexible display panel, a display device, and a manufacturing method of the flexible display panel.

An embodiment of the present disclosure provides a flexible display panel, which includes: a flexible base substrate, a conducting layer arranged in a display region of the flexible base substrate, a plurality of wires arranged in an edge bendable region of the flexible base substrate, and an inorganic insulating layer arranged between the conducting layer and the plurality of wires and the flexible base substrate. The conducting layer and the plurality of wires are electrically connected and are arranged at the same layer. The flexible display panel further includes:

a first organic insulating layer at least arranged in the edge bendable region of the flexible base substrate, wherein the first organic insulating layer is positioned between the plurality of wires and the inorganic insulating layer, and a material of the first organic insulating layer is a cured photoresist.

In a possible implementation manner, in the flexible display panel provided by the above embodiment of the present disclosure, the material of the first organic insulating layer is photosensitive polyimide.

In a possible implementation manner, in the flexible display panel provided by the above embodiment of the present disclosure, the first organic insulating layer is also arranged in the display region of the flexible base substrate; and the first organic insulating layer is positioned between the conducting layer and the inorganic insulating layer.

In a possible implementation manner, in the flexible display panel provided by the above embodiment of the present disclosure, the conducting layer is a source-drain metal layer.

The inorganic insulating layer includes a gate insulator layer and an interlayer insulating layer.

In a possible implementation manner, in the flexible display panel provided by the above embodiment of the present disclosure, the first organic insulating layer is configured to pattern the gate insulator layer and the interlayer insulating layer.

In a possible implementation manner, in the flexible display panel provided by the above embodiment of the present disclosure, an area of a via hole pattern of the first organic insulating layer is greater than that of a via hole pattern of the interlayer insulating layer.

In a possible implementation manner, the flexible display panel provided by the above embodiment of the present disclosure further includes: a second organic insulating layer at least arranged in the edge bendable region of the flexible base substrate, and the second organic insulating layer is positioned on the plurality of wires.

In a possible implementation manner, in the flexible display panel provided by the above embodiment of the present disclosure, the second organic insulating layer and a planarization layer, a photo spacer or a pixel defining layer in the display region of the flexible base substrate are arranged in the same layer.

In a possible implementation manner, the flexible display panel provided by the above embodiment of the present disclosure further includes an organic light emitting diode or a quantum dot light emitting diode arranged on the conducting layer in the display region of the flexible base substrate.

An embodiment of the present disclosure further provides a display device, which includes the above flexible display panel.

An embodiment of the present disclosure further provides a manufacturing method of a flexible display panel, wherein the manufacturing method includes:

providing a flexible base substrate;

sequentially forming an inorganic insulating film layer and a photoresist film layer in a display region of the flexible base substrate and an edge bendable region of the flexible base substrate;

patterning the inorganic insulating film layer by using the photoresist film layer to form a pattern of an inorganic insulating layer;

curing at least the photoresist layer in the edge bendable region of the flexible base substrate to form a first organic insulating layer; and forming a conducting layer on the inorganic insulating layer in the display region of the flexible base substrate, and meanwhile forming a plurality of wires on the first organic insulating layer in the edge bendable region of the flexible base substrate.

In a possible implementation manner, in the manufacturing method provided by the above embodiment of the present disclosure, the curing at least the photoresist film layer in the edge bendable region of the flexible base substrate to form a first organic insulating layer specifically includes:

simultaneously curing the photoresist film layer in the edge bendable region of the flexible base substrate and the photoresist film layer in the display region of the flexible base substrate to form the first organic insulating layer.

In a possible implementation manner, in the manufacturing method provided by the above embodiment of the present disclosure, after simultaneously curing the photoresist film layer in the edge bendable region of the flexible base substrate and the photoresist film layer in the display region of the flexible base substrate to form the first organic insulating layer, the manufacturing method further includes:

performing an ashing process on a via hole pattern of the photoresist film layer, such that an area of a via hole pattern of the first organic insulating layer is greater than that of a via hole pattern of the inorganic insulating layer.

In a possible implementation manner, in the manufacturing method provided by the above embodiment of the present disclosure, after forming a conducting layer on the inorganic insulating layer in the display region of the flexible base substrate, and meanwhile forming a plurality of wires on the first organic insulating layer in the edge bendable region of the flexible base substrate, the manufacturing method further includes:

forming a second organic insulating layer on the plurality of wires in the edge bendable region of the flexible base substrate.

In a possible implementation manner, in the manufacturing method provided by the above embodiment of the present disclosure, when forming a second organic insulating layer on the plurality of wires in the edge bendable region of the flexible base substrate, the manufacturing method further includes:

forming a planarization layer, a spacer layer or a pixel defining layer in the display region of the flexible base substrate.

BRIEF DESCRIPTION OF THE DRAWINGS

To describe the technical solutions of the embodiments of the present disclosure or that of the prior art more clearly, the accompanying drawings required for describing the embodiments or the prior art will be briefly introduced below. The accompanying drawings in the following description are merely some embodiments of the present disclosure. To those of ordinary skills in the art, other accompanying drawings may also be derived from these accompanying drawings without creative efforts.

DETAILED DESCRIPTION

A flexible display panel, a display device, and a manufacturing method of the flexible display panel provided by embodiments of the present disclosure are described in detail below with reference to the accompanying drawings.

Thicknesses and shapes of various film layers in the accompanying drawings do not reflect the real ratio of the flexible display panel, and are merely intended to illustrate the contents of the present invention.

Figure 1A:
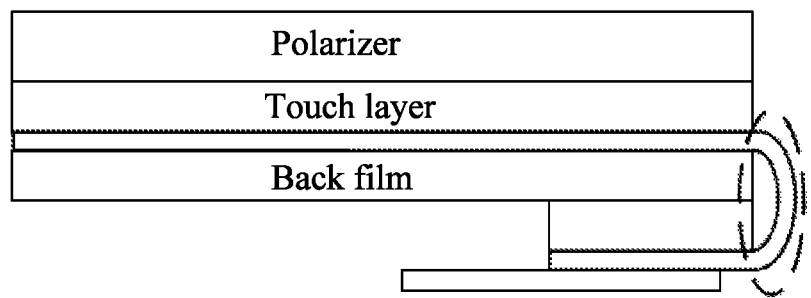
FIG. 1A is a schematic structural diagram I of a flexible display panel according to a comparative example of the present disclosure.
Figure 1B:
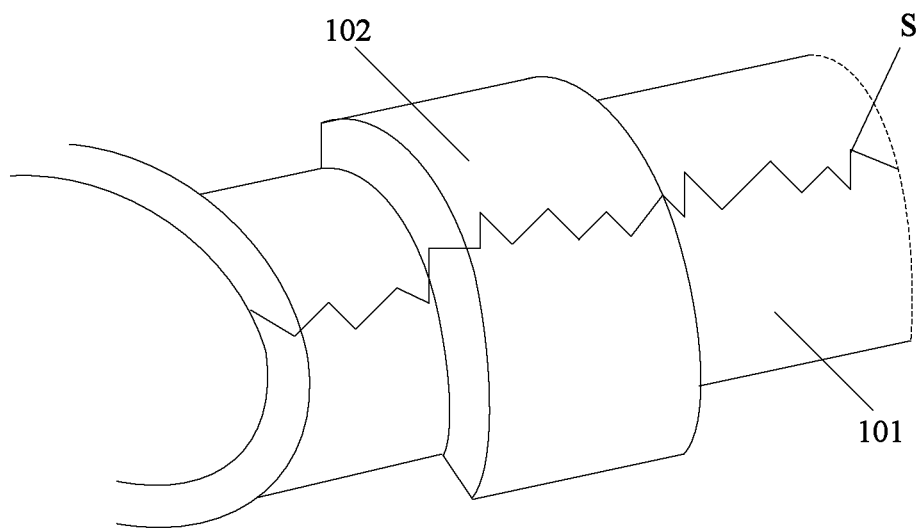
FIG. 1B is a schematic structural diagram of a dashed line portion amplified in FIG. 1A.
Figure 2:
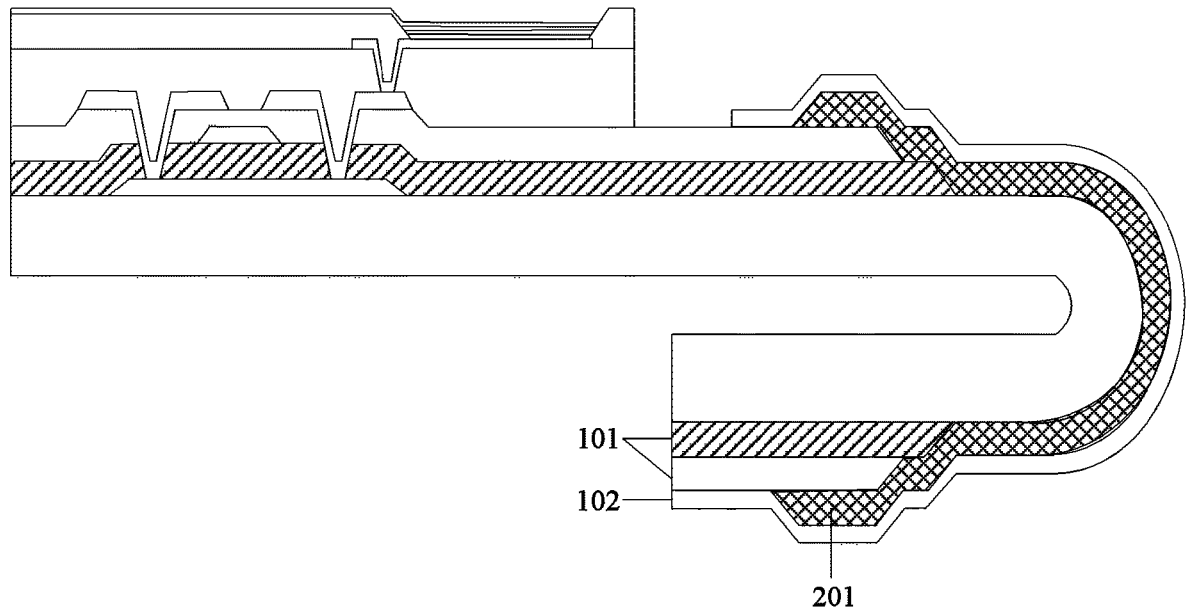
FIG. 2 is a schematic structural diagram II of a flexible display panel in the related art.

FIG. 1A and FIG. 1B illustrate a flexible display panel according to comparative examples of the present disclosure. As shown in FIG. 1A and FIG. 1B, because of greater brittleness of an inorganic insulating layer 101, Crack S may occur in the inorganic insulating layer 101 in a bendable region of a display product due to Pad Bendable, and may be further propagated to a signal line layer 102, thereby resulting in display failure. To prevent the occurrence of the cracks S in the inorganic insulating layer 101 of the bendable region, as shown in FIG. 2, in the related art, a mask process is added to remove the inorganic insulating layer 101 of the bendable region. Next, another mask process is added to form an organic insulating layer 201 in the bendable region. Then the signal line layer 102 is formed on the organic insulating layer 201. Thus, since the inorganic insulating layer 101 is not present in the bendable region, a crack is less likely to occur when Pad Bendable is implemented, and is far less likely to propagate to the signal line layer 102. In this way, the display failure is effectively prevented.

Embodiment I

Figure 3:
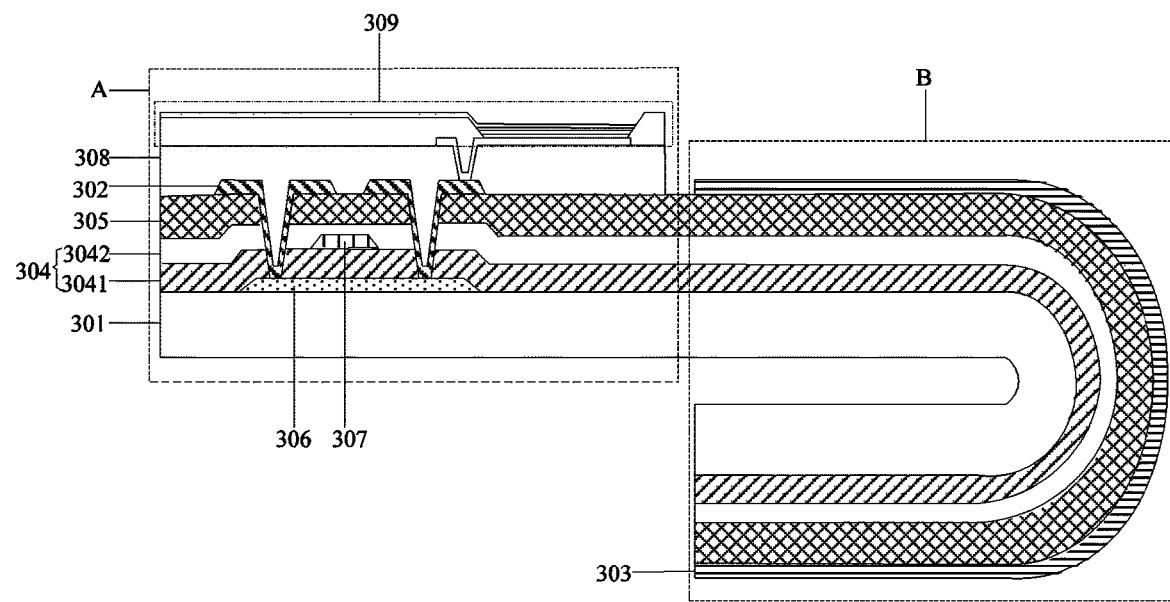
FIG. 3 is a schematic structural diagram of a flexible display panel according to an embodiment I of the present disclosure.

The Embodiment I of the present disclosure provides a flexible display panel. As shown in FIG. 3, the flexible display panel includes: a flexible base substrate 301, a conducting layer 302 arranged in a display region A of the flexible base substrate, a plurality of wires 303 arranged in an edge bendable region B of the flexible base substrate, and an inorganic insulating layer 304 arranged between the conducting layer 302 and the plurality of wires 303 and the flexible base substrate 301. The conducting layer 302 and the plurality of wires 303 are electrically connected and are arranged at the same layer. Particularly, the flexible display panel further includes:

a first organic insulating layer 305 at least arranged in the edge bendable region B of the flexible base substrate. The first organic insulating layer 305 is positioned between the plurality of wires 303 and the inorganic insulating layer 304, and a material of the first organic insulating layer 305 is a cured photoresist. In an embodiment, the photoresist has good bendable properties and thermal stability. For example, the photoresist may be photosensitive polyimide, which is not limited herein.

In the above flexible display panel provided by the Embodiment I of the present disclosure, the first organic insulating layer 305 is arranged in the edge bendable region B of the flexible base substrate, and the first organic insulating layer 305 is positioned between the plurality of wires 303 and the inorganic insulating layer 304. Therefore, when the inorganic insulating layer 304 in the edge bendable region B of the flexible base substrate has a crack, the first organic insulating layer 305 between the plurality of wires 303 and the inorganic insulating layer 304 may have a shielding effect, thus effectively preventing the crack from propagating to a film layer where the plurality of wires 303 are located, and thereby avoiding the phenomenon of display failure. Further, the material of the first organic insulating layer 305 is a cured photoresist, in specific implementation, the photoresist may be a photoresist coated in the process of fabricating the inorganic insulating layer 304. Therefore, compared to the related art adopting a technical solution in which two mask processes are added, the present disclosure may save the two mask processes, thereby saving production costs and improving production efficiency. In addition, the conducting layer 302 and the plurality of wires 303 are arranged in the same layer, such that the conducting layer 302 and the plurality of wires 303 may be simultaneously fabricated by using one patterning process, which simplifies fabrication processes and saves production costs.

In a specific implementation, in the above flexible display panel provided by the Embodiment I of the present disclosure, as shown in FIG. 3, the conducting layer 302 is a source-drain metal layer and a signal line. The inorganic insulating layer 304 includes a gate insulator layer 3041 and the interlayer insulating layer 3042, and the interlayer insulating layer 3042 is positioned on a side of the gate insulator layer 3041 facing away from the flexible base substrate 301. The first organic insulating layer 305 is configured to form a via hole pattern of the gate insulator layer 3041 and a via hole pattern of the interlayer insulating layer 3042. The material of the conducting layer 302 and the materials of the plurality of wires 303 may be one of molybdenum, aluminum, tungsten, titanium and copper or a combination of alloys, but not limited thereto. The material of the inorganic insulating layer 304 may be one of silicon oxide and silicon nitride or a combination thereof, but not limited thereto. Generally, the inorganic insulating layer 304 has a via hole pattern, and the via hole pattern of the inorganic insulating layer 304 is positioned in the display region A of the flexible base substrate.

Specifically, as shown in FIG. 3, the above flexible display panel provided by the Embodiment I of the present disclosure may further include an active layer 306 positioned between the flexible base substrate 301 and the gate insulator layer 3041, and a gate metal layer 307 and a gate scan line (not shown in the figure) positioned between the gate insulator layer 3041 and the interlayer insulating layer 3042. Specifically, the material of the active layer 306 may be a polysilicon semiconductor material, an amorphous silicon semiconductor material, an oxide semiconductor material or an organic semiconductor material, but not limited thereto. The material of the gate metal layer 307 and the material of the gate scan line may be one of molybdenum, aluminum, tungsten, titanium and copper or a combination of alloys, but not limited thereto.

Specifically, as shown in FIG. 3, the above flexible display panel provided by the Embodiment I of the present disclosure may further include a planarization layer 308, an organic light emitting diode or a quantum dot light emitting diode (QLED) 309 sequentially arranged on the conducting layer 302 in the display region A of the flexible base substrate. The material of the planarization layer 308 may be an organic insulating material such as polyacrylic resin, polyepoxy acrylic resin, photosensitive polyimide resin, polyester acrylate, urethane acrylate resin or phenolic epoxy acrylic resin, but not limited thereto.

Embodiment II

A flexible display panel provided by the Embodiment II of the present disclosure is structurally similar to the flexible display panel provided by the Embodiment I of the present disclosure. Here, only differences between the flexible display panel provided by the Embodiment II of the present disclosure and the flexible display panel provided by the Embodiment I of the present disclosure are introduced, and repeated contents are omitted here.

As can be seen from the above description, in the flexible display panel provided by the Embodiment I of the present disclosure, the inorganic insulating layer 304 has a via hole pattern. In practical applications, the conducting layer 302 at the via hole pattern may be broken, which has a negative effect on the display effect of the flexible display panel.

Figure 4:
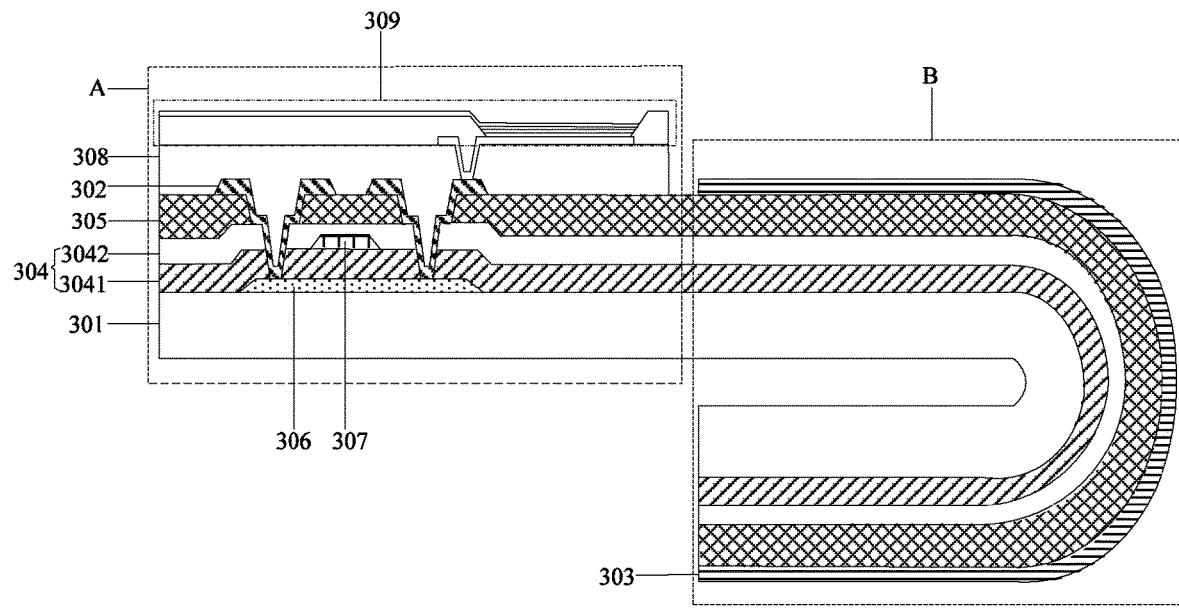
FIG. 4 is a schematic structural diagram of a flexible display panel according to an embodiment II of the present disclosure.

Specifically, to prevent the conducting layer 302 from being broken at the via hole pattern, in the above flexible display panel provided by the Embodiment II of the present disclosure, as shown in FIG. 4, an area of a via hole pattern of the first organic insulating layer 305 is greater than that of a via hole pattern of the interlayer insulating layer 3042. With this arrangement, a slope angle of the conducting layer 302 may be improved, thereby effectively preventing the conducting layer 302 from being broken at the via hole pattern.

In addition, materials of each film layer in the above flexible display panel provided by the Embodiment II of the present disclosure are the same as those of each film layer in the flexible display panel provided by the Embodiment I of the present disclosure, and thus details are omitted herein.

Embodiment III

A flexible display panel provided by the Embodiment III of the present disclosure is structurally similar to the flexible display panel provided by the Embodiment II of the present disclosure. Here, only differences between the flexible display panel provided by the Embodiment III of the present disclosure and the flexible display panel provided by the Embodiment II of the present disclosure are introduced, and repeated contents are omitted here.

Figure 5:
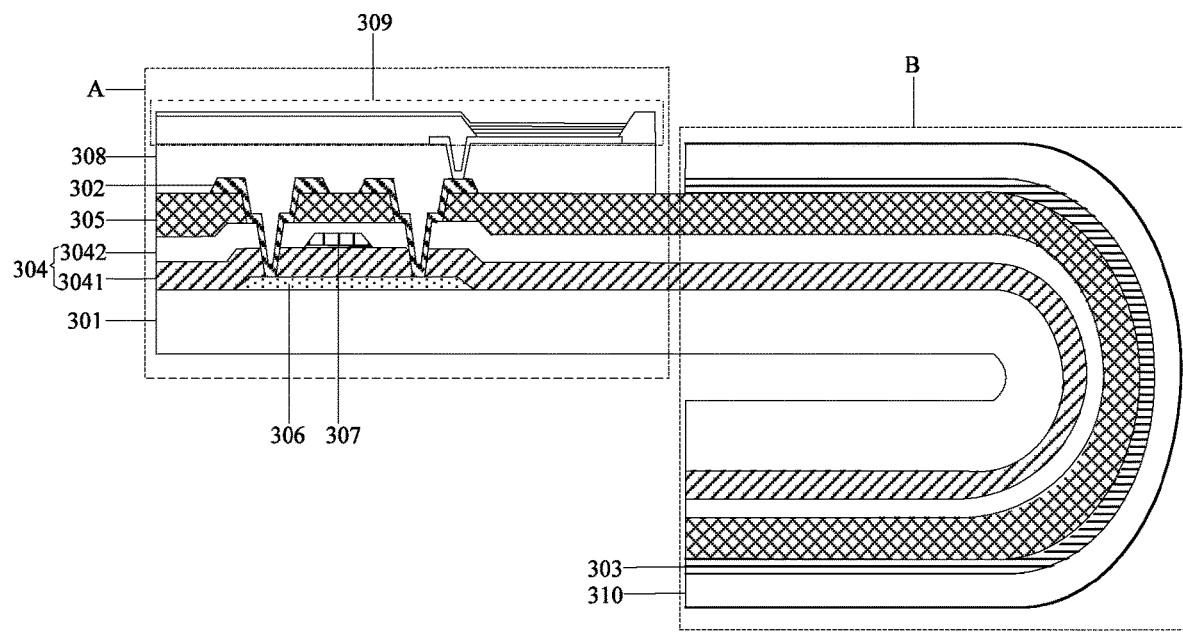
FIG. 5 is a schematic structural diagram of a flexible display panel according to an embodiment III of the present disclosure.

Specifically, on the basis of the flexible display panel provided by the Embodiment II of the present disclosure, to prevent the plurality of wires 303 in the edge bendable region B of the flexible base substrate from being scratched, in the above flexible display panel provided by the Embodiment III of the present disclosure, as shown in FIG. 5, a second organic insulating layer 310 at least arrange in the edge bendable region B of the flexible base substrate is added, and the second organic insulating layer 310 is positioned above the plurality of wires 303, i.e., the second organic insulating layer 310 is positioned on a side of the plurality of wires 303 facing away from the flexible base substrate 301. In this way, the second organic insulating layer 310 may protect the plurality of wires 303 from being scratched, thereby improving the display quality.

Specifically, in the above flexible display panel provided by the Embodiment III of the present disclosure, the second organic insulating layer 310 may be a film layer arranged separately, or may be a film layer arranged in the same layer as the planarization layer 308 in the display region A of the flexible base substrate, but not limited thereto. When the second organic insulating layer 310 and the planarization layer 308 are arranged in the same layer, the second organic insulating layer 310 and the planarization layer 308 may be simultaneously fabricated by using one patterning process, which simplifies fabrication processes and saves production costs. Furthermore, a pixel organic layer in the display region A of the flexible base substrate generally includes a planarization layer, a photo spacer (PS), and a pixel defining layer. Therefore, in specific implementation, the second organic insulating layer 310 and the photo spacer or the pixel defining layer also may be arranged in the same layer, which is not limited herein.

Moreover, materials of each film layer in the above flexible display panel provided by the Embodiment III of the present disclosure are the same as those of each film layer in the flexible display panel provided by the Embodiment II of the present disclosure, and thus details are omitted herein.

It is to be noted that, in specific implementations, the above flexible display panel provided by the Embodiment III of the present disclosure may be further improved on the basis of the flexible display panel provided by the Embodiment I of the present disclosure. That is, only the second organic insulating layer 310 is added, which is at least arranged on the plurality of wires 303 in the edge bendable region B of the flexible base substrate, but the size of the via hole pattern of the first organic insulating layer 305 and the size of the via hole pattern of the interlayer insulating layer 3042 are not limited.

Embodiment IV

Figure 6:
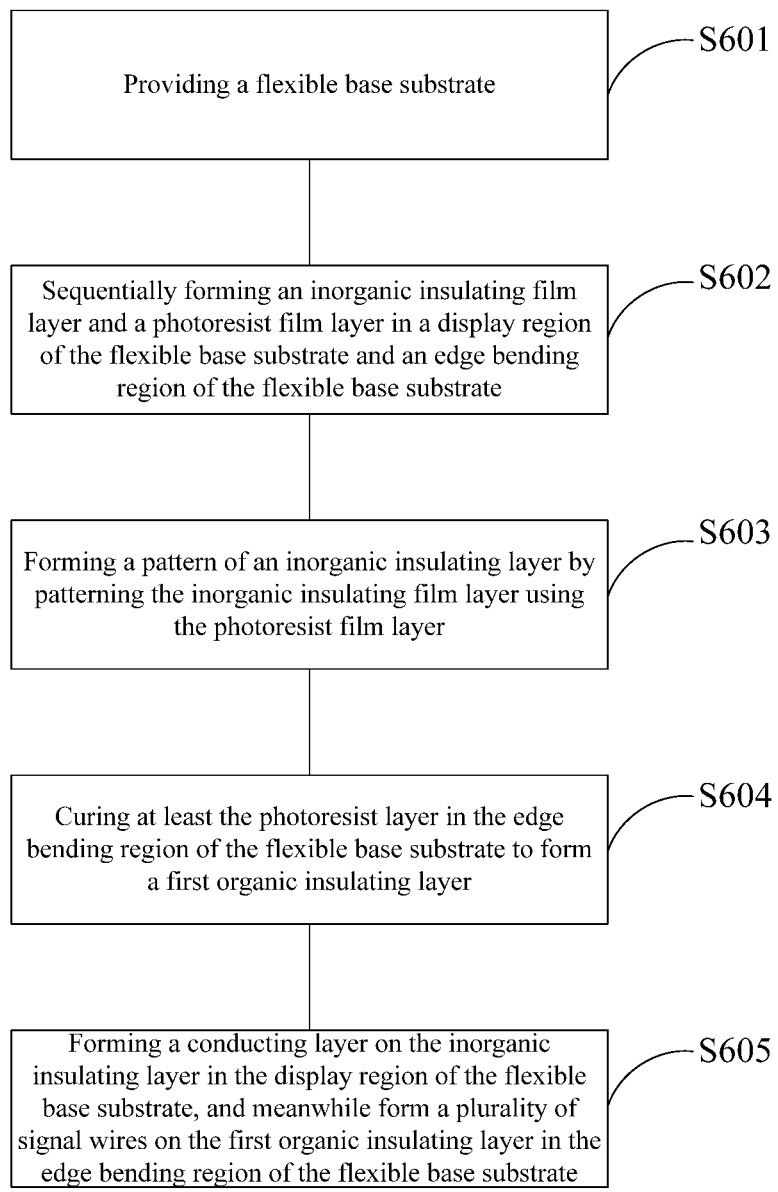
FIG. 6 is a flowchart of a manufacturing method of a flexible display panel according to an embodiment IV of the present disclosure.

Correspondingly, for the above flexible display panel provided by the Embodiment I of the present disclosure, the Embodiment IV of the present disclosure provides a manufacturing method of the flexible display panel. As shown in FIG. 6, the manufacturing method may specifically include the following steps:

S601: providing a flexible base substrate;

S602: sequentially forming an inorganic insulating film layer and a photoresist film layer in a display region of the flexible base substrate and an edge bendable region of the flexible base substrate;

S603: forming a pattern of an inorganic insulating layer by patterning the inorganic insulating film layer using the photoresist film layer;

S604: curing at least the photoresist layer in the edge bendable region of the flexible base substrate to form a first organic insulating layer; and S605: forming a conducting layer on the inorganic insulating layer in the display region of the flexible base substrate, and meanwhile forming a plurality of wires on the first organic insulating layer in the edge bendable region of the flexible base substrate.

Specifically, in the manufacturing method of the flexible display panel provided by the Embodiment IV of the present disclosure, the conducting layer is a source-drain metal layer and a signal line. The Step S603 of patterning the inorganic insulating film layer by using the photoresist film layer to form a pattern of an inorganic insulating layer specifically may be implemented by:

patterning the inorganic insulating film layer by using the photoresist film layer to form a gate insulator layer and an interlayer insulating layer.

In specific implementation, in the manufacturing method provided by the Embodiment IV of the present disclosure, before the Step S603 of patterning the inorganic insulating film layer by using the photoresist film layer to form a pattern of an inorganic insulating layer, the manufacturing method may further include: sequentially forming an active layer, a gate insulator layer, and a gate metal layer and a gate scan line on the display region of the flexible base substrate.

Specifically, in the manufacturing method provided by the above embodiment of the present disclosure, in the Step S604 of curing at least the photoresist film layer in the edge bendable region of the flexible base substrate to form a first organic insulating layer specifically may be implemented by:

simultaneously curing the photoresist film layer in the edge bendable region of the flexible base substrate and the photoresist film layer in the display region of the flexible base substrate to form the first organic insulating layer.

In specific implementation, in the manufacturing method provided by the Embodiment IV of the present disclosure, after the Step S605 of forming a conducting layer on the inorganic insulating layer in the display region of the flexible base substrate, and meanwhile forming a plurality of wires on the first organic insulating layer in the edge bendable region of the flexible base substrate, the manufacturing method may further include: sequentially forming a planarization layer, an organic light emitting diode or a quantum dot light emitting diode in the conducting layer in the display region of the flexible base substrate.

Specifically, to better understand the above manufacturing method provided by the Embodiment IV of the present disclosure, as shown in FIG. 7A to FIG. 7E, schematic structural diagrams of corresponding flexible display panels after performing each step of the manufacturing method provided by the Embodiment IV of the present disclosure are illustrated.

Figure 7A:
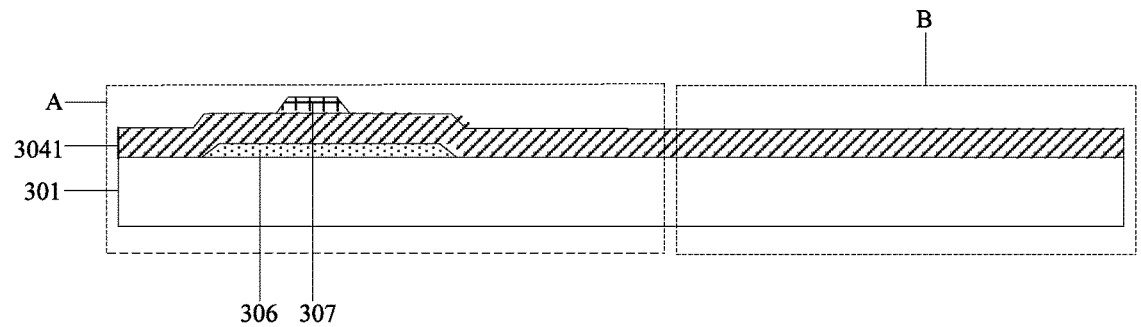
FIG. 7A-FIG. 7E respectively are schematic structural diagrams of corresponding flexible display panels after performing each step of the manufacturing method of the flexible display panel according to the embodiment IV of the present disclosure.

A flexible base substrate 301 is provided, and an active layer 306, a gate insulator layer 3041, a gate metal layer 307 and a gate scan line (not shown in the figure) are sequentially formed on the flexible base substrate 301, as shown in FIG. 7A.

Figure 7B:
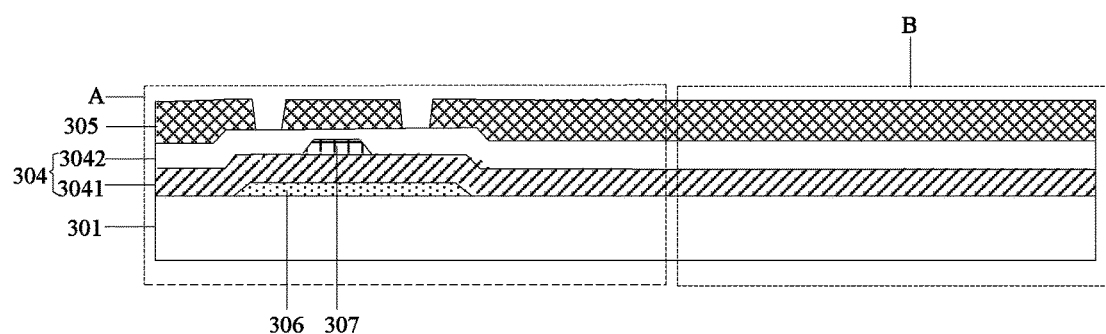

An interlayer insulating film layer and a photoresist film layer are deposited on the film layer where the gate metal layer 307 and the gate scan line are; and a flexible display panel is formed by developing after exposing the photoresist film layer by using a mask, as shown in FIG. 7B.

Figure 7C:
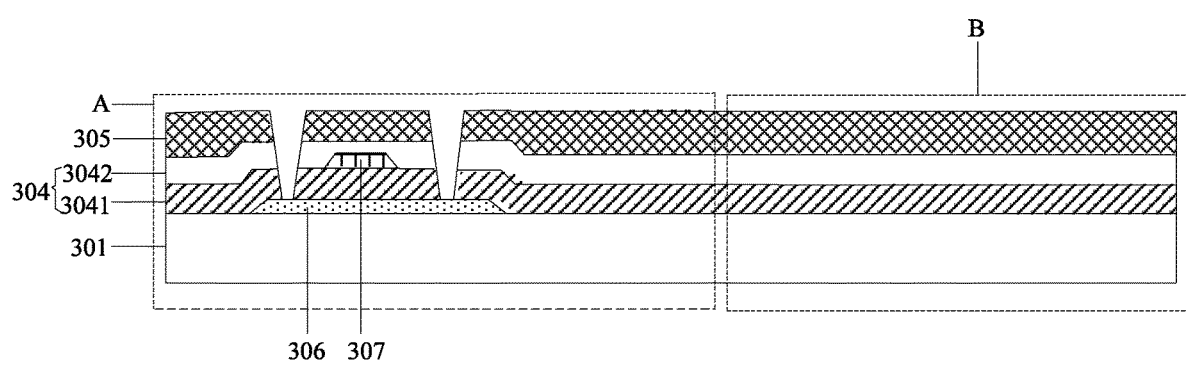

The interlayer insulating layer 3042 having a via hole pattern is formed by etching the interlayer insulating film layer in the display region A of the flexible base substrate by using a pattern of the photoresist film layer developed and exposed. Next, the photoresist film layer in the edge bendable region of the flexible base substrate and the photoresist film layer in the display region of the flexible base substrate are simultaneously cured to form the first organic insulating layer 305, as shown in FIG. 7C.

Figure 7D:
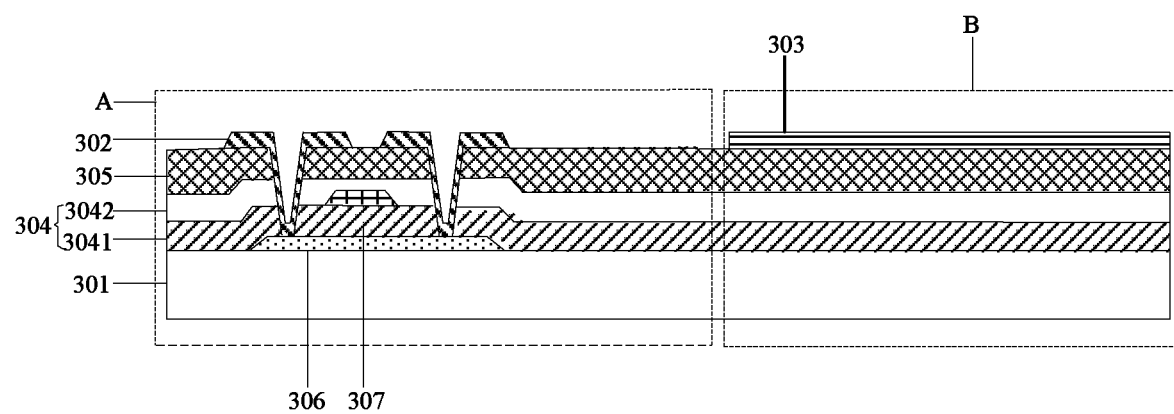

Next, the conducting layer 302 is formed on the interlayer insulating layer 3042 in the display region A of the flexible base substrate, and meanwhile the plurality of wires 303 are formed on the first organic insulating layer 305 in the edge bendable region B of the flexible base substrate, as shown in FIG. 7D.

Figure 7E:
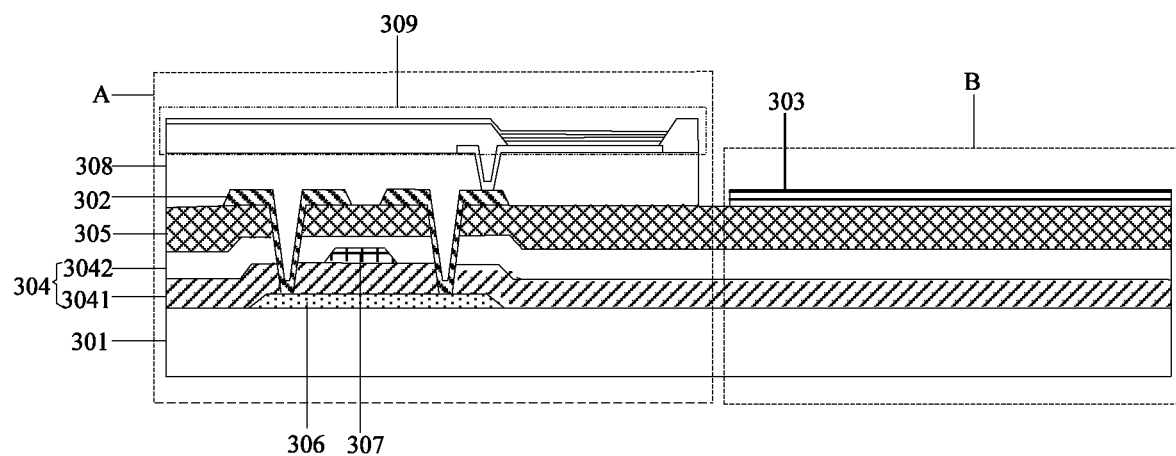

The planarization layer 308 and an organic light emitting diode or a quantum dot light emitting diode 309 are sequentially formed on the conducting layer 302 in the display region A of the flexible base substrate, as shown in FIG. 7E.

It is to be noted that in the above manufacturing method provided by the Embodiment IV of the present disclosure, patterning processes involved in forming each layer structure not only may include a part of or all processes such as photoresist coating, mask masking, exposing, developing, etching, photoresist stripping and so on, but also may include other processes, which are specifically subject to forming patterns in the actual fabrication process, but not limited thereto. For example, a post-baking process may also be included after developing and before etching. The etching may be dry etching or wet etching, which is not limited herein.

In addition, reference may be made to contents related to the flexible display panel provided by the Embodiment I of the present disclosure for contents related to materials of each film layer of the flexible display panel in the above manufacturing method provided by the Embodiment IV of the present disclosure, and details are omitted herein.

Embodiment V

Correspondingly, for the above flexible display panel provided by the Embodiment II of the present disclosure, the Embodiment V of the present disclosure provides a manufacturing method of the flexible display panel. The manufacturing method of the flexible display panel provided by the Embodiment V of the present disclosure is similar to the manufacturing method of the flexible display panel provided by the Embodiment IV of the present disclosure. Here, only differences between the manufacturing method of the flexible display panel provided by the Embodiment V of the present disclosure and the manufacturing method of the flexible display panel provided by the Embodiment IV of the present disclosure are introduced, and repeated contents are omitted.

Figure 8:
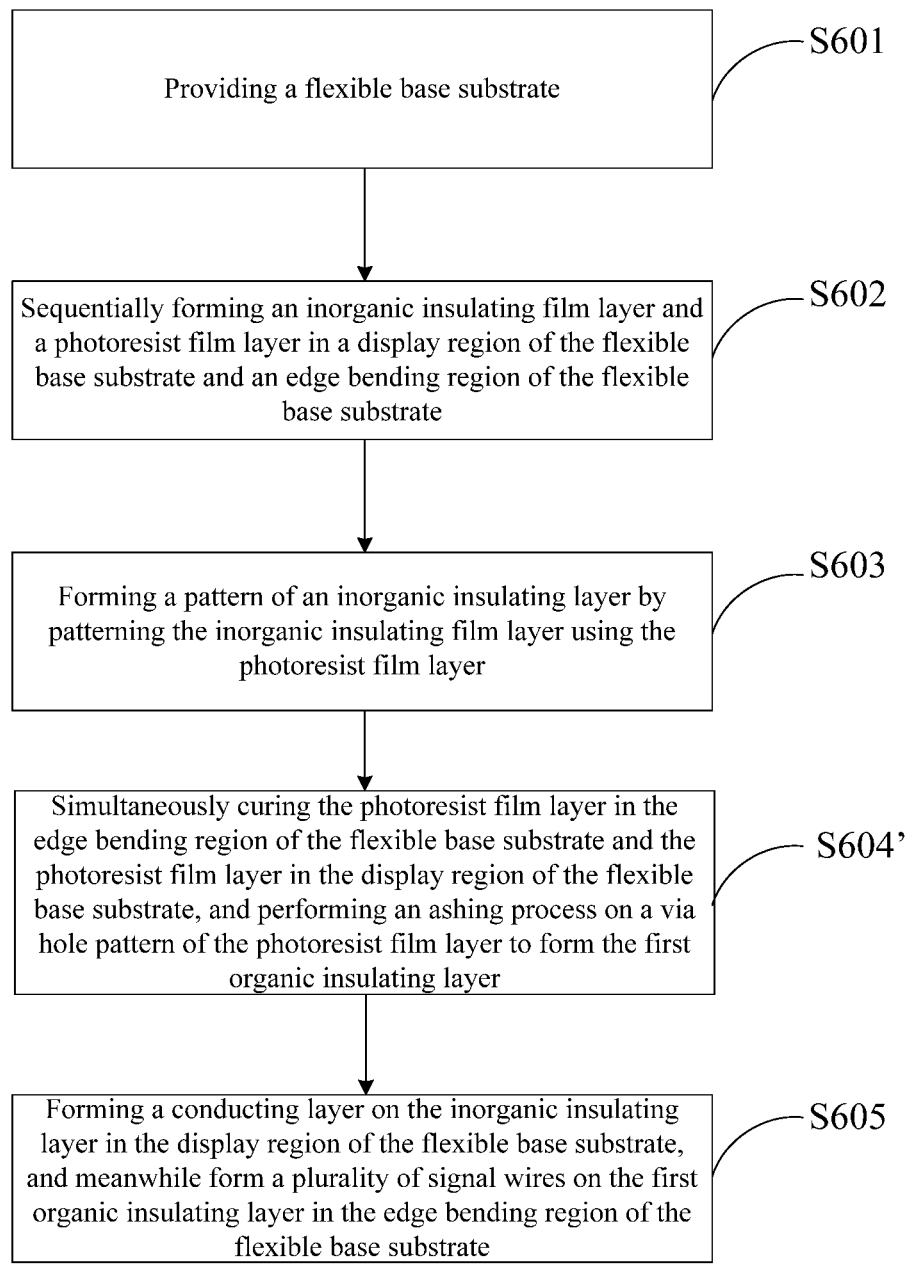
FIG. 8 is a flowchart of a manufacturing method of a flexible display panel according to an embodiment V of the present disclosure.

Specifically, different from the Step S604 of curing at least the photoresist layer in the edge bendable region of the flexible base substrate to form a first organic insulating layer in the manufacturing method of the flexible display panel provided by the Embodiment IV of the present disclosure, in the manufacturing method provided by the Embodiment V of the present disclosure, as shown in FIG. 8, after Step S604 of simultaneously curing the photoresist film layer in the edge bendable region of the flexible base substrate and the photoresist film layer in the display region of the flexible base substrate, performing an ashing process on a via hole pattern of the photoresist film layer to form the first organic insulating layer, such that an area of a via hole pattern of the first organic insulating layer is greater than that of a via hole pattern of the inorganic insulating layer, so as to lay a foundation for subsequently forming the conducting layer.

In addition, reference may be made to contents related to the flexible display panel provided by the Embodiment II of the present disclosure for contents related to materials of each film layer of the flexible display panel in the above manufacturing method provided by the Embodiment V of the present disclosure, and details are omitted herein.

Embodiment VI

Correspondingly, for the above flexible display panel provided by the Embodiment III of the present disclosure, the Embodiment VI of the present disclosure provides a manufacturing method of the flexible display panel. The manufacturing method of the flexible display panel provided by the Embodiment VI of the present disclosure is similar to the manufacturing method of the flexible display panel provided by the Embodiment V of the present disclosure. Here, only differences between the manufacturing method of the flexible display panel provided by the Embodiment VI of the present disclosure and the manufacturing method of the flexible display panel provided by the Embodiment V of the present disclosure are introduced, and repeated contents are omitted.

Figure 9:
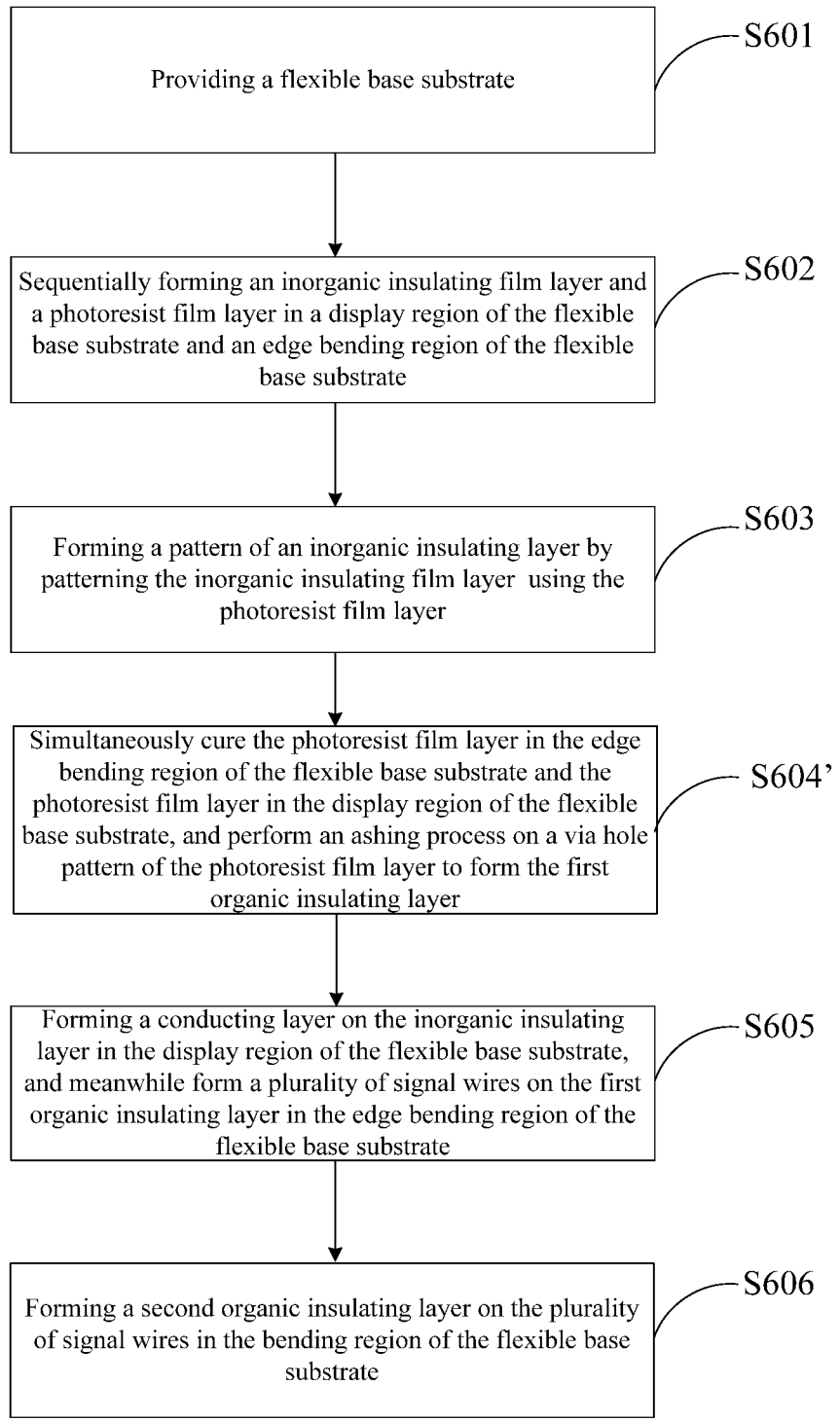
FIG. 9 is a flowchart of a manufacturing method of a flexible display panel according to an embodiment VI of the present disclosure.

Specifically, after the Step S605 of forming a plurality of wires on the first organic insulating layer in the edge bendable region of the flexible base substrate in the manufacturing method of the flexible display panel provided by the Embodiment V of the present disclosure, the manufacturing method of the flexible display panel provided by the Embodiment VI of the present disclosure as shown in FIG. 9 may further include:

S606: forming a second organic insulating layer on the plurality of wires in the edge bendable region of the flexible base substrate.

In this way, the second organic insulating layer may protect the plurality of wires from being scratched, thereby improving the display quality.

Specifically, in the manufacturing method provided by the Embodiment VI of the present disclosure, the Step S606 of forming a second organic insulating layer on the plurality of wires in the edge bendable region of the flexible base substrate specifically may be implemented by:

forming the second organic insulating layer on the plurality of wires in the bendable region of the flexible base substrate when forming the planarization layer on the conducting layer in the display region of the flexible base substrate.

Specifically, the pixel organic layer in the display region A of the flexible base substrate generally includes a planarization layer, a photo spacer (PS), and a pixel defining layer. Therefore, in the manufacturing method of the flexible display panel provided by the Embodiment VI of the present disclosure, the Step S606 of forming a second organic insulating layer on the plurality of wires in the bendable region of the flexible base substrate specifically may be implemented by:

forming the second organic insulating layer on the plurality of wires in the bendable region of the flexible base substrate when forming the photo spacer or the pixel defining layer on the conducting layer in the display region of the flexible base substrate, but not limited thereto.

In addition, reference may be made to contents related to the flexible display panel provided by the Embodiment III of the present disclosure for contents related to materials of each film layer of the flexible display panel in the above manufacturing method provided by the Embodiment VI of the present disclosure, and details are omitted herein.

Based on the same inventive concept, an embodiment of the present disclosure further provides a display device, which includes the foregoing flexible display panel provided by the above embodiments of the present disclosure. The display device may be any product or component having display function, such as a mobile phone, a tablet computer, a TV set, a display, a notebook computer, a digital photo frame, a navigation device and so on. Reference may be made to the embodiments of the flexible display panel for the embodiments of the display device, and the repeated contents are omitted herein.

Embodiments of the present disclosure provide a flexible display panel, a display device, and a manufacturing method of the flexible display panel. The flexible display panel includes: a flexible base substrate, a conducting layer arranged in a display region of the flexible base substrate, a plurality of wires arranged in an edge bendable region of the flexible base substrate, and an inorganic insulating layer arranged between the conducting layer and the plurality of wires and the flexible base substrate. The conducting layer and the plurality of wires are electrically connected and are arranged at the same layer. Furthermore, the flexible display panel also includes: a first organic insulating layer at least arranged in the edge bendable region of the flexible base substrate. The first organic insulating layer is positioned between the plurality of wires and the inorganic insulating layer, and a material of the first organic insulating layer is a cured photoresist. The first organic insulating layer is arranged in the edge bendable region of the flexible base substrate, and the first organic insulating layer is positioned between the plurality of wires and the inorganic insulating layer. Therefore, when the inorganic insulating layer in the edge bendable region of the flexible base substrate has a crack, the first organic insulating layer between the plurality of wires and the inorganic insulating layer may have a shielding effect, thus effectively preventing the crack from propagating to a film layer where the plurality of wires are, and thereby avoiding the phenomenon of display failure. Further, the material of the first organic insulating layer is a cured photoresist, in specific implementation, the photoresist may be a photoresist coated in the process of fabricating the inorganic insulating layer. Therefore, compared to the related art adopting a technical solution in which two mask processes are added, the present disclosure may save the two mask processes, thereby saving production costs and improving production efficiency. In addition, the conducting layer and the plurality of wires are arranged in the same layer, such that the conducting layer and the plurality of wires may be simultaneously fabricated by using one patterning process, which simplifies fabrication processes and saves production costs.

Beneficial effects of the present disclosure are as below.

Embodiments of the present disclosure provide a flexible display panel, a display device, and a manufacturing method of the flexible display panel. The flexible display panel includes: a flexible base substrate, a conducting layer arranged in a display region of the flexible base substrate, a plurality of wires arranged in an edge bendable region of the flexible base substrate, and an inorganic insulating layer arranged between the conducting layer and the plurality of wires and the flexible base substrate. The conducting layer and the plurality of wires are electrically connected and are arranged at the same layer. Furthermore, the flexible display panel also includes: a first organic insulating layer at least arranged in the edge bendable region of the flexible base substrate. The first organic insulating layer is positioned between the plurality of wires and the inorganic insulating layer, and a material of the first organic insulating layer is a cured photoresist. The first organic insulating layer is arranged in the edge bendable region of the flexible base substrate, and the first organic insulating layer is positioned between the plurality of wires and the inorganic insulating layer. Therefore, when the inorganic insulating layer in the edge bendable region of the flexible base substrate has a crack, the first organic insulating layer between the plurality of wires and the inorganic insulating layer may have a shielding effect, thus effectively preventing the crack from propagating to a film layer where the plurality of wires are, and thereby avoiding the phenomenon of display failure. Further, the material of the first organic insulating layer is a cured photoresist, in specific implementation, the photoresist may be a photoresist coated in the process of fabricating the inorganic insulating layer. Therefore, compared to the related art adopting a technical solution in which two mask processes are added, the present disclosure may save the two mask processes, thereby saving production costs and improving production efficiency.

Obviously, those skilled in the art may alter or modify the present disclosure without departing from the spirit and scope of the present disclosure. Thus, if these alterations and modifications of the present disclosure fall within the scope of claims of the present disclosure and equivalent technologies thereof, the present disclosure is intended to cover these alterations and modifications.

What is claimed is:

1. A manufacturing method of a flexible display panel, comprising:
   providing a flexible base substrate;
   sequentially forming an inorganic insulating film layer and a photoresist film layer in a display region of the flexible base substrate and an edge bendable region of the flexible base substrate;
   patterning the inorganic insulating film layer using the photoresist film layer to form a pattern of an inorganic insulating layer;
   curing at least the photoresist film layer in the edge bendable region of the flexible base substrate to form a first organic insulating layer, the photoresist film layer as cured being a photoresist coated during fabrication of the inorganic insulating layer, the first organic insulating layer covering the inorganic insulating layer; and
   forming a conducting layer on the inorganic insulating layer in the display region of the flexible base substrate while forming a plurality of wires on the first organic insulating layer in the edge bendable region of the flexible base substrate;
   wherein the first organic insulating layer is further arranged in the display region of the flexible base substrate, and the first organic insulating layer is positioned between the conducting layer and the inorganic insulating layer.

2. The manufacturing method according to claim 1, wherein the curing at least the photoresist film layer in the edge bendable region of the flexible base substrate to form a first organic insulating layer specifically comprises:
   simultaneously curing the photoresist film layer in the edge bendable region of the flexible base substrate and the photoresist film layer in the display region of the flexible base substrate to form the first organic insulating layer.

3. The manufacturing method according to claim 2, wherein after simultaneously curing the photoresist film layer in the edge bendable region of the flexible base substrate and the photoresist film layer in the display region of the flexible base substrate to form the first organic insulating layer, the manufacturing method further comprises:
   performing an ashing process on a via hole pattern of the photoresist film layer, such that an area of a via hole pattern of the first organic insulating layer is greater than that of a via hole pattern of the inorganic insulating layer.

4. The manufacturing method according to claim 1, wherein, after forming the conducting layer on the inorganic insulating layer in the display region of the flexible base substrate while forming the plurality of wires on the first organic insulating layer in the edge bendable region of the flexible base substrate, the manufacturing method further comprises:
   forming a second organic insulating layer on the plurality of wires in the edge bendable region of the flexible base substrate.

5. The manufacturing method according to claim 4, wherein, when forming a second organic insulating layer on the plurality of wires in the edge bendable region of the flexible base substrate, the manufacturing method further comprises:

forming a planarization layer, a spacer layer, or a pixel defining layer in the display region of the flexible base substrate.

\* \* \* \* \*